United States Patent [19]

Ang

[11] Patent Number: 5,668,765
[45] Date of Patent: Sep. 16, 1997

[54] CHARGE TRANSFER SENSE AMPLIFIER

[75] Inventor: Michael Anthony Ang, Santa Clara, Calif.

[73] Assignee: Philips Electronics North America Corporation, New York, N.Y.

[21] Appl. No.: 659,384

[22] Filed: Jun. 6, 1996

[51] Int. Cl.[6] .................................................. G11C 7/00
[52] U.S. Cl. ........................ 365/205; 365/208; 327/57
[58] Field of Search ........................... 365/205, 207, 365/208; 327/51, 50, 52, 55, 57

[56] References Cited

U.S. PATENT DOCUMENTS

| | | | |
|---|---|---|---|
| 4,910,714 | 3/1990 | Hartgring | 365/208 |
| 5,253,137 | 10/1993 | Seevinck | 365/230.01 |
| 5,412,607 | 5/1995 | Kusaba | 365/208 |
| 5,534,800 | 7/1996 | Hiraki et al. | 365/205 |

FOREIGN PATENT DOCUMENTS

| | | |
|---|---|---|
| 07141874A | 6/1995 | Japan . |
| 08077780A | 3/1996 | Japan . |

*Primary Examiner*—David C. Nelms
*Assistant Examiner*—Son Mai

[57] ABSTRACT

An electronic memory has a voltage sense amplifier coupled to a memory cell via a bit line for supply of an output signal under control of data stored in the cell. The sense amplifier is both powered and controlled by redistribution of electric charge, representative of the data and initially accumulated at the bit line, between the bit line and the output of the sense amplifier.

10 Claims, 1 Drawing Sheet

CHARGE TRANSFER SENSE AMPLIFIER

FIELD OF THE INVENTION

The invention relates to an electronic circuit with a memory that has a memory cell for storing data, a bit line selectively connected to the cell, and a voltage sense amplifier. The voltage sense amplifier has an input selectively connected to the bit line for sensing a bit line voltage representative of the data, and an output for providing an output signal representative of the data.

BACKGROUND ART

U.S. Pat. No. 5,083,295 issued to Lammerts et al. (PHN 12,754) shows a circuit as specified in the preamble. The memory cells of a particular column in the known circuit are connected to a particular pair of bit lines. The bit lines are connected to the inputs of inverting logic gates that form a bistable element in the sense amplifier. Prior to accessing a particular cell of the column, the bit lines are precharged to a predetermined voltage level. When the specific cell is being read, it affects the voltages of the bit lines dependent on the cell's logic state. The sense amplifier then connects each respective one of the bit lines to a respective one of the power supply nodes under control of the resulting voltage difference in order to render the voltage difference more pronounced. Before a next sensing operation can be carried out, the bit lines have to be precharged again to the predetermined level.

Precharging for the full voltage swing is both time consuming and power consuming. Also, the known memory circuit needs static biasing of the bit lines and requires multiple control signals.

OBJECT OF THE INVENTION

It is, inter alia, an object of the invention to provide a memory circuit that consumes essentially less power than the circuit of the prior art. It is a further object to provide a memory circuit that can operate at lower supply voltages and that requires less substrate area than the circuit of the prior art. It is a further object to provide a memory circuit that requires fewer control signals to govern its operation.

SUMMARY OF THE INVENTION

To this end, the invention provides a circuit as specified in the preamble, wherein the voltage sense amplifier is powered by the bit line voltage through transfer of electric charge from the bit line to the voltage sense amplifier, and wherein the output supplies the output signal created from the charge being redistributed between the bit line and the output of the voltage sense amplifier.

The powering of the voltage sense amplifier and the creation of the output signal are based on redistribution of the bit line charge and occur simultaneously upon connecting the bit line to the voltage sense amplifier. In the prior art, connecting the sense amplifier to the bit lines and sampling are two separate actions executed one after the other. Accordingly, there is no separate sampling time period as in the prior art.

The sense amplifier in the invention has fewer control signals to control operation than the sense amplifier in the prior an circuit. As a result, the circuit in the invention is more robust than the known circuit, since there are less timing issues to pay attention to.

Further, the known sense amplifier comprises two cross-coupled inverters that are enabled by a separate sample signal and that are driven at their outputs by the signal at the bit lines. Before the known circuit finally latches in one of two logic states, the circuit bleeds a fair amount of current. Upon being connected to the bit line, the sense amplifier in the invention merely redistributes the charges in the combined system of output and bit line dependent on the data in the memory cell. A next precharge cycle in the circuit of the invention only requires replenishing the charge that has been lost in the previous cycle during the charge distribution, whereas in the prior art the bit lines need to be completely pulled up again to the supply voltage. Accordingly, the circuit of the invention consumes essentially less power than the known sense amplifier.

Note that the capacitance of the bit line is larger than that of the sense amplifier by several orders of magnitude. The invention uses the bit line charge to serve both as the power supply and input signal to the sense amplifier in order to drive the sense amplifier. The sense amplifier in the invention does not have nodes directly and permanently connected to the memory's power supply node (VDD) as in the art cited above. Therefore, the layout of the memory is simpler and requires less substrate area than that of the prior art owing to, among other things, the absence of such power supply contacts. Further, the only condition imposed on the voltage of the bit line is that it be sufficiently high to enable the charge transfer process to occur from the bit line to the sense amplifier. Consequently, the sense amplifier in the invention is suitable for use in low-voltage environments.

A preferred embodiment of the circuit in the invention is characterized by the following. The memory has a further bit line, and the cell is selectively connected to the bit line and to the further bit line. The voltage sense amplifier has a further input selectively connected to the cell via the further bit line, and a further output for providing a further output signal representative of the data. The voltage sense amplifier comprises a regenerative feedback arrangement connected to the input, the further input, the output and the further output, and operative to drive the transfer of the charge.

The differential voltage between the bit line and the further bit line drives the sense amplifier and controls the transfer and distribution of charge among the bit lines and the outputs of the sense amplifier through regenerative feedback. That is, the output signals are caused to act upon the inputs to re-create a corresponding differential voltage at the outputs. The sense amplifier in the invention is capable of operating under much smaller voltage differences than the circuit in the prior art, while consuming far less power.

BRIEF DESCRIPTION OF THE DRAWING

The invention is explained below in further detail and by way of example with reference to the accompanying drawing wherein.

DETAILED EMBODIMENTS

Figure 1:
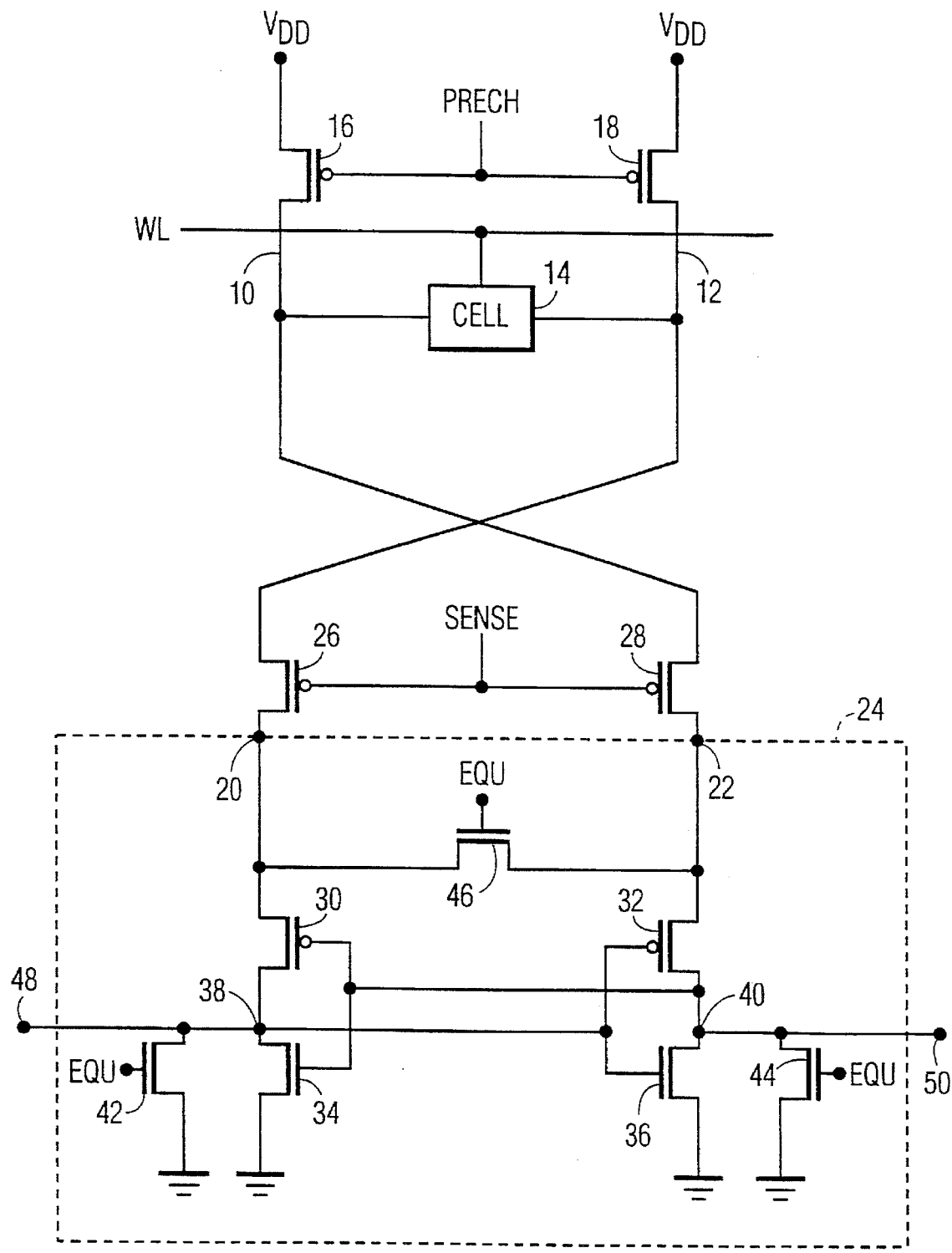
FIG. 1 is a diagram of part of a memory circuit in the invention.

FIG. 1 is a diagram of part of a memory circuit according to the invention wherein the cells are arranged in rows and columns. The portion shown illustrates a particular column with two bit lines 10 and 12 connected to a plurality of memory cells. Only one memory cell 14 is drawn in order to not obscure the drawing. In this example, cell 14 is, e.g., an SRAM cell known in the art and not explained in further detail. Cell 14 is connected to word line WL to control access to cell 14 through bit lines 10 and 12 upon selection. Bit lines 10 and 12 are connected to a power supply node VDD via precharge PFETs 16 and 18, respectively. Control electrodes of precharge PFETs 16 and 18 are connected to each other and receive a precharge signal "prech." in operational use. Bit lines 10 and 12 are connected to input nodes 20 and 22 of a sense amplifier 24 via access PFETs 26 and 28, respectively. Access PFETs 26 and 28 have their control electrodes connected to each other and enable connecting bit lines 10 and 12 to sense amplifier 24 upon reception of an enable signal "sense".

Sense amplifier 24 comprises PFETs 30 and 32, and NFETs 34 and 36. PFET 30 and NFET 34 have their main current channels connected in series via an output node 38 and are arranged between input node 20 and ground. PFET 32 and NFET 36 have their main current channels connected in series between via an output node 40 and are connected between input node 22 and ground. Control electrodes of PFET 30 and NFET 34 are connected together and to output node 40. Control electrodes of PFET 32 and NFET 36 are connected together and to output node 38. These cross-coupled series arrangements form controlled current paths between bit lines 10 and 12, and ground. Sense amplifier 24 further comprises equalizing NFETs 42, 44 and 46 whose control electrodes receive an equalizing signal "equ" in operational use. Equalizing NFET 42 is arranged in parallel with NFET 34. Equalizing NFET 44 is arranged in parallel with NFET 36. Equalizing NFET 46 has its main current path connected between input nodes 20 and 22.

Operation is as follows. Before carrying out the sensing of cell 14, bit lines 10 and 12 are precharged through precharge PFETs 16 and 18 to pull bit lines 10 and 12 all the way up to VDD PFETs 26 and 28 remain turned off Also prior to sensing, equalizing NFETs 42, 44 and 46 are turned on in order to equalize the voltage between input nodes 20 and 22, and between output nodes 38 and 40. The equalizing operation discharges nodes 20, 22, 38 and 40 to ground. Then, equalizing NFETs 42, 44 and 46 are turned off. Cell 14 is connected to bit lines 10 and 12 through control of word line WL. This enables cell 14 to affect the voltages of precharged bit lines 10 and 12. Preferably, precharge PFETs 16 and 18 have been turned off before connecting cell 14 to bit lines 10 and 12 in order to not interfere with the information content of cell 14.

Thereafter, PFETs 26 and 28 are being turned on to start sensing. Assume that the state of cell 14, representative of the data stored, forces the voltage of input node 20 to be slightly higher than the voltage of input node 22. For example, VDD is 3.3 volt, the voltage of input node 20 is initially 3.2 volt and the voltage of input node 22 is initially 3.1 volt. Then, PFET 30 is conducting slightly better than PFET 32 so that the voltage of output node 38 increases at a higher rate than the voltage of output node 40. As a consequence, NFET 36 is turned on before NFET 34 is, if the latter is turned on at all. NFET 36 being turned on counteracts the charging of output node 40 through PFET 32 as a result of which the voltage at output node 40 ceases to rise, thus keeping PFET 30 conductive. Due to this regenerative feedback of the cross-coupled arrangement, PFET 32 and NFET 34 are being turned off completely, and PFET 30 and NFET 36 are turned on in the final state of sense amplifier 24. That is, the voltage of output node 38 is pulled up, whereas the voltage of output node 40 is pulled down to ground. The voltage of output node 38 is determined by the capacitive charge distribution between bit line 12 and output node 38. Since bit line 12 has a substantially higher capacitance than output node 38, the voltage at node 20 may have dropped only slightly. A similar process occurs, mutatis mutandis, in case the voltage of node 22 is slightly higher than the voltage of node 20.

The operation described is based upon the transfer of charge from bit lines 12 and 10 to output nodes 38 and 40. Typically, the charge transfer eventually results in reversing the polarity of the voltage difference between input nodes 20 and 22. That is, assuming that the voltage of input node 20 was initially higher than the voltage of input node 22, as in the example discussed above, the voltage of input node 20 in the final state is lower than the voltage of input node 22. The charge that is initially on bit line 12 is redistributed between bit line 12 on the one hand and the capacitances of the sense amplifier, e.g., the capacitance of output node 38, on the other hand. PFET 32 has been turned off early in the process so that the charge lost from bit line 10 is much smaller, resulting in the voltage of input node 22 being substantially what is was before.

If necessary, output nodes 38 and 40 may be connected to respective buffers (not shown), e.g., CMOS inverters, to restore signal integrity.

Note that, since the capacitance of bit lines 10 and 12 is much higher than that of nodes 20, 22, 38 and 40 of voltage sense amplifier 24, the next precharge cycle requires only restoring the electric charge lost in the capacitive distribution among bit lines 10 and 12 and sense amplifier 24.

Note that cross-coupled FETs 30, 32, 34 and 36 form a regenerative feedback arrangement, rather than a full fledged latch as the cross-coupled CMOS inverters of the prior art.

Also note that the memory circuit can have multiple columns of cells, wherein each time a single one of the columns can be selectively connected to voltage sense amplifier 24.

The transistors in the example shown have the following typical width-to-length (W/L) ratio. For PFETs 26, 28, 30 and 32, W/L is 10/0.6. For NFETs 34 and 36, W/L is 10/0.6. For NFETs 42 and 44, W/L is 3/0.6. For NFET 46, W/L is 2/0.6.

Sense amplifier 24 in the example shown is differentially controlled by bit line 10 and complementary bit line 12. In a first alternative embodiment, a similar sense amplifier 24 may be connected to a single bit line and to a reference voltage source, such as a dummy cell or a node with a fixed reference voltage of an appropriate level, to operate sense amplifier 24. However, a circuit processing unipolar signals may be more sensitive to noise and process parameter spread than one operating with differential signals.

In a second alternative embodiment, NFETs 34 and 36 are omitted. The capacitances of output nodes 38 and 40 are initially discharged to ground through NFETs 42 and 44 before the actual sensing occurs. Now, when input node 20 has a higher voltage than input node 22, PFET 30 conducts a higher current than PFET 32. The voltage of output node 38 therefore increases at a faster rate than the voltage of output node 40. PFET 32 then is turned off before PFET 30 gets the chance to be turned off. As a result, output node 38 and input node 20 reach substantially the same level, whereas output node 40 stays isolated from input node 22 and at least a threshold below that level. Compared to the embodiment of FIG. 1, the differential output signal of sense amplifier 24, i.e., the voltage between output nodes 38 and 40 now is smaller and may need some restoration by succeeding buffers (not shown).

In a third alternative embodiment, PFETs 30 and 32, or NFETs 34 and 36 may be replaced by passive loads such as resistors. This, however increases power consumption and renders the resulting circuit slower than that of FIG. 1.

What is claimed is:

1. An electronic circuit with a memory that has:

a memory cell for storing data;

a bit line selectively connected to the cell;

a voltage sense amplifier having an input selectively connected to the bit line for sensing a bit line voltage representative of the data, and an output for providing an output signal representative of the data, wherein:

the voltage sense amplifier is powered by the bit line voltage through transfer of electric charge from the bit line to the voltage sense amplifier, the output supplies the output signal created from the charge being redistributed between the bit line and the output of the voltage sense amplifier, and the sense amplifier has means for precharging the output so that the output is electrically connected to the bit line when the sense amplifier starts sensing.

2. The circuit of claim 1 wherein:

the memory has a further bit line;

the cell is selectively connected to the bit line and to the further bit line;

the voltage sense amplifier has a further input selectively connected to the cell via the further bit line;

the voltage sense amplifier has a further output for providing a further output signal representative of the data;

the voltage sense amplifier comprises a regenerative feedback arrangement connected to the input, the further input, the output and the further output, and operative to drive the transfer of the charge.

3. The circuit of claim 2, wherein the regenerative feedback arrangement comprises: a first current path between the input and the output; a second current path between the further input and the further output; wherein:

a first voltage of the output controls the transfer of charge through the second current path;

a second voltage of the further output controls the transfer of charge through the first current path.

4. The circuit of claim 3, wherein the regenerative feedback arrangement further comprises:

a third current path between the output and a reference node;

a fourth current path between the further output and the reference node;

wherein:

the first voltage controls the fourth current path;

the second voltage controls the third current path;

conductivities of the first and third current paths are oppositely controlled by the second voltage;

conductivities of the second and fourth current paths are oppositely controlled by the first voltage.

5. The circuit of claim 2, wherein the sense amplifier has an equalizing path between the input and the further input for equalizing voltages of the bit line and the further bit line under control of an equalizing signal.

6. The circuit of claim 3, wherein the means for precharging has a first discharging path connected between the output and a reference node, and a second discharging path connected between the further output and the reference node for discharging and equalizing the output and the further output under control of an equalizing signal.

7. A voltage sense amplifier for use in the circuit of claim 3.

8. A voltage sense amplifier for use in the circuit of claim 4.

9. A voltage sense amplifier for use in the circuit of claim 5.

10. A voltage sense amplifier for use in the circuit of claim 6.

* * * * *